United States Patent [19]
Germini

[11] Patent Number: 5,719,490
[45] Date of Patent: Feb. 17, 1998

[54] DUAL SOURCED VOLTAGE SUPPLY CIRCUIT

[75] Inventor: Valeria Germini, Monza, Italy

[73] Assignee: SGS-Thomson Microelectronics S.r.l., Agrate Brianza, Italy

[21] Appl. No.: 521,991

[22] Filed: Aug. 31, 1995

[30] Foreign Application Priority Data

Aug. 31, 1994 [EP] European Pat. Off. ............ 94830416

[51] Int. Cl.$^6$ ................................ G05F 1/56; G11C 13/00
[52] U.S. Cl. ..................... 323/265; 365/726; 307/80
[58] Field of Search ...................... 323/265; 365/226; 307/43, 51, 52, 64, 65, 80

[56] References Cited

U.S. PATENT DOCUMENTS

| | | | |
|---|---|---|---|
| Re. 33,087 | 10/1989 | Bradford | 307/64 |
| 3,686,549 | 8/1972 | Winebrener | 318/139 |
| 4,658,156 | 4/1987 | Hashimoto | 307/350 |
| 4,694,430 | 9/1987 | Rosier | 365/189 |
| 4,975,883 | 12/1990 | Baker et al. | 365/226 |
| 5,301,161 | 4/1994 | Landgraf et al. | 365/229 |
| 5,341,034 | 8/1994 | Matthews | 307/296.1 |
| 5,420,798 | 5/1995 | Lin et al. | 364/483 |
| 5,548,549 | 8/1996 | Ong | 365/185.05 |

*Primary Examiner*—Adolf Berhane
*Attorney, Agent, or Firm*—David V. Carlson; Robert E. Mates; Seed and Berry LLP

[57] ABSTRACT

A dual sourced voltage supply circuit for use with a flash EPROM or the like and comprising output voltage circuitry including an input for receiving a control signal determining which of two voltage supplies is used to provide an output of the dual sourced voltage supply circuit. The output voltage is provided by one of the two voltage supplies by means of a controllable conductive path connected between one voltage supply and an output node of the circuit. Such controllable conductive path comprises, in series, a first MOSFET transistor connected to the voltage supply and a second MOSFET transistor connected to the output node, both transistors are of the same conductivity type and are arranged to be activated in dependence on the input of the output voltage circuitry; moreover, each transistor has a body connection connected to a respective channel electrode; the body connections are arranged to prevent charge injection occurring between the other channel electrode of the same transistor and the body of the second and first transistor respectively.

29 Claims, 6 Drawing Sheets

| | Selected Cell | | | Unselected Cell Same Row | | | Unselected Cell Same Column | | |
|---|---|---|---|---|---|---|---|---|---|
| | Drain Voltage | Gate Voltage | Souce Voltage | Drain Voltage | Gate Voltage | Souce Voltage | Drain Voltage | Gate Voltage | Souce Voltage |
| PROGRAM | -5V | Vpp | $V_{GND}$ | $V_{GND}$ | Vpp | $V_{GND}$ | -5V | $V_{GND}$ | $V_{GND}$ |
| ERASE* | FLOATING | $V_{GND}$ | Vpp | FLOATING | $V_{GND}$ | Vpp | FLOATING | $V_{GND}$ | Vpp |
| READ | BIASED TO -1V | -5V | $V_{GND}$ | $V_{GND}$ | -5V | $V_{GND}$ | BIASED TO -1V | $V_{GND}$ | $V_{GND}$ |

* ALL CELLS SELECTED IN ERASE

FIG. 6

DUAL SOURCED VOLTAGE SUPPLY CIRCUIT

TECHNICAL FIELD

The present invention relates to a dual sourced voltage supply circuit and includes such a circuit for use in a flash EPROM, EEPROM, non-volatile memory, or other integrated circuit devices.

BACKGROUND OF THE INVENTION

The subject matter of the present invention is similar to U.S. Pat. No. 5,517,153 filed on Jun. 7, 1995, and entitled "POWER SUPPLY ISOLATION AND SWITCHING CIRCUITS."

Flash EPROMs have a number of single transistor cells each of which has a floating gate. In order to read, program and erase a cell, it is necessary to have two operating voltages, Vpp and Vcc. Vpp is of particular importance for programming and erasing and is typically of the order of 12 V. Vcc on the other hand is the normal operating voltage and is usually of the order of 3 V or 5 V. Vcc is also used during programming to ensure that the right values are programmed into the cells.

Difficulties can occur if one or other of the voltage supplies fails and Vpp or Vcc is lost. For example control of the data being programmed into the memory can be lost, leading to uncertainty of the value in each cell of the memory and possible data loss. It is to avoid difficulties of this nature that dual sourced voltage supply circuits have been provided. These circuits are arranged to provide a voltage output Vop generated either from Vcc or Vpp depending on which of the two voltages is present. The voltage output can then be used for example to generate a reset signal and/or to switch off various elements of the flash EPROM. In this way, when the missing voltage supply is again provided, the memory will be in a known state and normal functioning of the memory can be obtained.

One known dual sourced voltage supply circuit is provided for a flash EPROM using Vcc of about 5 V and Vpp of about 12 V. When the voltage output is generated from Vcc, in the absence of Vpp, the voltage output is equal to Vcc-Vtn where Vtn is the threshold value of an n-channel MOSFET connected as a diode. This MOSFET acts as a switch to control whether or not Vcc provides the output voltage and is arranged between a Vcc supply node and a low voltage output Vop node. In one known arrangement Vtn can be around 9 V.

However this arrangement is not suitable for flash EPROMs which use a Vcc of around 3.3 V as a low voltage output Vop of around 2.2 V would be obtained or even lower in certain cases where the Vcc supply voltage fluctuates. The voltage output may be too low to provide a power supply for circuitry which provides a reset signal. Additionally the voltage output may be so low that the rate that various logic elements react is too slow for reliable operation.

It is therefore an object of the invention to provide a dual sourced voltage supply circuit, for example for a flash EPROM, which is capable of providing, if necessary, a voltage output equal to a supply voltage providing the output voltage, for example Vcc.

SUMMARY OF THE INVENTION

According to one aspect of the invention, there is provided a dual sourced voltage supply circuit for use with a flash EPROM or the like, said circuit comprising output voltage circuitry comprising an input for receiving a control signal, said control signal determining which of two voltage supplies is used to provide an output of said dual sourced voltage supply circuit, said output voltage being provided by one of said voltage supplies by means of a controllable conductive path connected between said one voltage supply and an output node of the circuit, said controllable conductive path comprising, in series, a first MOSFET transistor connected to the voltage supply and a second MOSFET transistor connected to the output node, said first and second MOSFET transistors being of the same conductivity type and each MOSFET transistor having respective body connections, said body connections being connected to a respective channel electrode of each of said MOSFET transistors, the body connections of said first and second MOSFET transistors being arranged to prevent charge injection occurring between the other channel electrode and the body of the second and first MOSFET transistors respective, the first and second MOSFET transistors being arranged to be activated in dependence on the input of the output voltage circuitry.

In the context of the present invention it will be appreciated that the term channel electrode refers to the source and drain of the MOSFET. The term substrate or body in this context, refers to the substrate of the MOSFET e.g. a p or n-well.

With this arrangement of the MOSFETs, one MOSFET protects the other MOSFET from charge or carrier injection caused by a forward biased diode being formed between one of the channel electrodes and the well or substrate in which the MOSFET is formed and vice versa. This problem arises as the voltage of the voltage supply may be greater than that at the output node and vice versa. Accordingly a single MOSFET or even a conventionally connected series of MOSFETs e.g. 2 p-type devices with the source of one device connected to the drain of the other, may be vulnerable to carrier injection.

Preferably the output voltage is provided by the other of the voltage supplies by a second controllable conductive path connected between the other voltage supply and the output node, said second controllable conductive path having first and second MOSFET transistors of the same conductivity type and each of the MOSFET transistors has a respective body connection, said body connections being connected to a respective channel electrode of each of said MOSFETs, the body connections of said first and second MOSFET transistors being arranged to prevent charge injection occurring between the other channel electrode and the body of the second and first MOSFET transistors respectively, the first and second MOSFET transistors being arranged to be activated in dependence on the input of the output voltage circuitry.

In a preferred embodiment, said MOSFETs transistors are p-channel devices arranged with their drains connected together and the sources connected to one of the voltage supplies and the output node respectively. Preferably the body connections are tied to the respective sources or points generally more positive than the source. While the MOSFETs can be n-type devices, with current technology most practical applications will use p-channel devices. If p-type devices are used, the sources and body or substrate connections may be directly connected to the respective potential voltage supplies, i.e., the voltage supply and the output node voltage. This gives good protection against carrier injection. In some circumstances, it may be possible to use n-channel devices.

It is preferred that said output voltage circuitry has signal generating circuitry which generates two pairs of signals whereby when the MOSFET transistors of one of the controllable conductive paths are on, the MOSFET transistors of the other controllable conductive path are off. The signal generating circuitry may comprise a series of inverters. Thus from a single input it is possible to control four MOSFET devices substantially simultaneously and thus the two controllable conductive paths. For example, two of the MOSFETs will be switched off while the other two will be switched on, depending on which of the two voltage supplies is to be used to provide the output voltage.

Preferably said circuit further comprises determining circuitry having at least one input from at least one of said voltage supplies for providing an output to the input of the output voltage circuitry, said output of the determining circuitry determining which of the voltage supplies is to provide the output voltage.

In preferred embodiments, the determining circuitry has inputs from both of said voltage supplies and provides a first signal when a first of said voltage supplies is present regardless of the presence or absence of the second voltage supply and a second signal if only the second voltage is present. Alternatively, the determining circuitry may only have one input from one of the voltage supplies. The output of the determining circuitry would then be indicative of whether or not that one voltage supply was present.

One voltage supply may be greater than the other voltage supply. Preferably said first voltage supply is greater than said second voltage supply. It is preferred that the output voltage derived from said one of the voltage supply be substantially equal to that voltage supply. In such arrangements, the controllable conductive path would comprise the two MOSFETs. The two MOSFETs have a reasonably low impedance and thus have virtually no voltage drop across them. The MOSFET arrangement used in embodiments of the invention thus has the advantage that the two MOSFETs can act more or less as a perfect switch so that there is no voltage drop across either MOSFET device and thus the output voltage equals the voltage supply from which it is generated.

If a voltage output less than the voltage supply providing the output voltage is desired, then diodes, resistors or the like can be connected in series with the two MOSFET transistors. In one embodiment of the invention, there may be one or more MOSFET devices connected as diodes in series with the two switching MOSFET devices so that the output voltage is less than the respective supply voltage.

The dual voltage supply circuit is preferably provided in a flash EPROM. However, the circuit can also be used in an EEPROM or the like or indeed with any arrangement having two voltage supplies and which requires an output voltage at all times.

Preferably the flash EPROM comprises a comparator arrangement having inputs from a Vcc supply and a reference voltage, the output voltage generated from said dual power source voltage supply circuit providing the power supply for the comparator arrangement, the comparator arrangement providing an output signal, when Vcc is less than the reference voltage, to switch off circuits providing voltages to an array of memory cells. Thus the output voltage generated by the dual sourced voltage supply circuit can be used to stop any programming/erasing of the memory. For example any circuitry connected to Vpp may be switched off as may the program load. The dual power supply generator may also be used to provide a reset signal which puts various logic circuits into a predetermined state. Preferably the output signal of the comparator arrangement is directly connected to said circuits to be switched off. Thus by switching off the circuits directly and not through any logic circuits, it is ensured that Vpp is not applied. The dual power supply generator can of course be arranged to act as a guaranteed power supply for circuitry of the flash EPROM where the loss of one or others of the supply voltages can cause difficulty.

When the dual sourced voltage supply circuit is used with a flash EPROM, the first voltage supply may be around 12 V while the second voltage supply may be 3.3 or 5 V. In those cases where the second voltage supply is 3.3 V, it is preferred that when the voltage supply is generated from the second voltage supply, the output voltage be equal to that second voltage supply. Preferably one of the conductive paths also comprises resistive elements whereby the output voltage generated from said first voltage is between 7 and 8 V.

According to a second aspect of the present invention, there is provided a dual sourced voltage supply circuit for use with a flash EPROM having two voltage supplies, said circuit comprising:

determining circuitry having at least one input from at least one of said voltage supplies for providing an output which determines which of the voltage supplies is to provide an output voltage; and output voltage circuitry having an input connected to the output of said determining circuitry, said output voltage circuitry operable to provide an output voltage from one or other of said voltage supplies in dependence on the input received from the determining circuitry, wherein the output voltage is provided by one of the voltage supplies by means of a controllable conductive path between said one voltage supply and an output node of the circuit, said controllable conductive path having two p-type MOSFET transistors connected between said one voltage supply and output node respectively, the drains of the MOSFET transistors being connected together and the sources being connected to the one voltage supply and output node respectively and the body connections being tied to respective sources, said MOSFET transistors being activated in dependence on the output of the determining circuitry.

According to a third aspect of the present invention, there is provided a method of providing an output voltage in a dual sourced voltage supply circuit, comprising the steps of;

selecting one of two voltage supplies from which to derive the output voltage;

providing a controllable conductive path between said selected voltage supply and an output node of the circuit, said controllable conductive path comprising in series a first MOSFET transistor connected to the selected voltage supply and a second MOSFET transistor connected to the output node wherein said first and second MOSFET transistors are of the same conductivity type and each have respective body connections, said body connections being connected to a respective channel electrode of each of said MOSFET transistors, the body connections of the said first and second MOSFET transistors being operable to prevent charge injection occurring between the other channel electrode and the body of the second and first MOSFET transistors respectively; and activating said MOSFET transistors to provide said output voltage derived from said selected voltage.

According to a further aspect of the invention, there is provided a voltage supply circuit having first and second voltage inputs of different voltage levels, a voltage output connectable to said first voltage input through a first switch circuit and connectable to said second voltage input through a second switch circuit, at least one of said switch circuits comprising two MOSFET transistors of the same conductivity type, said MOSFET transistors being connected back to back in series, each having a respective source to body connection, one source being connected to said voltage output, and control circuitry connected to said first and second switch circuits to operate said switch circuits and connect selectively only one of said voltage inputs to said voltage output, whereby there is substantially no voltage drop across said MOSFET transistors.

BRIEF DESCRIPTION OF THE DRAWINGS

An embodiment of the present invention will now be described by way of example and with reference to the accompanying drawings in which:

FIG. 6 is a table of the voltages which need to be applied to selected and unselected cells for each of a program, erase and read operation.

DETAILED DESCRIPTION OF THE INVENTION

Figure 1:
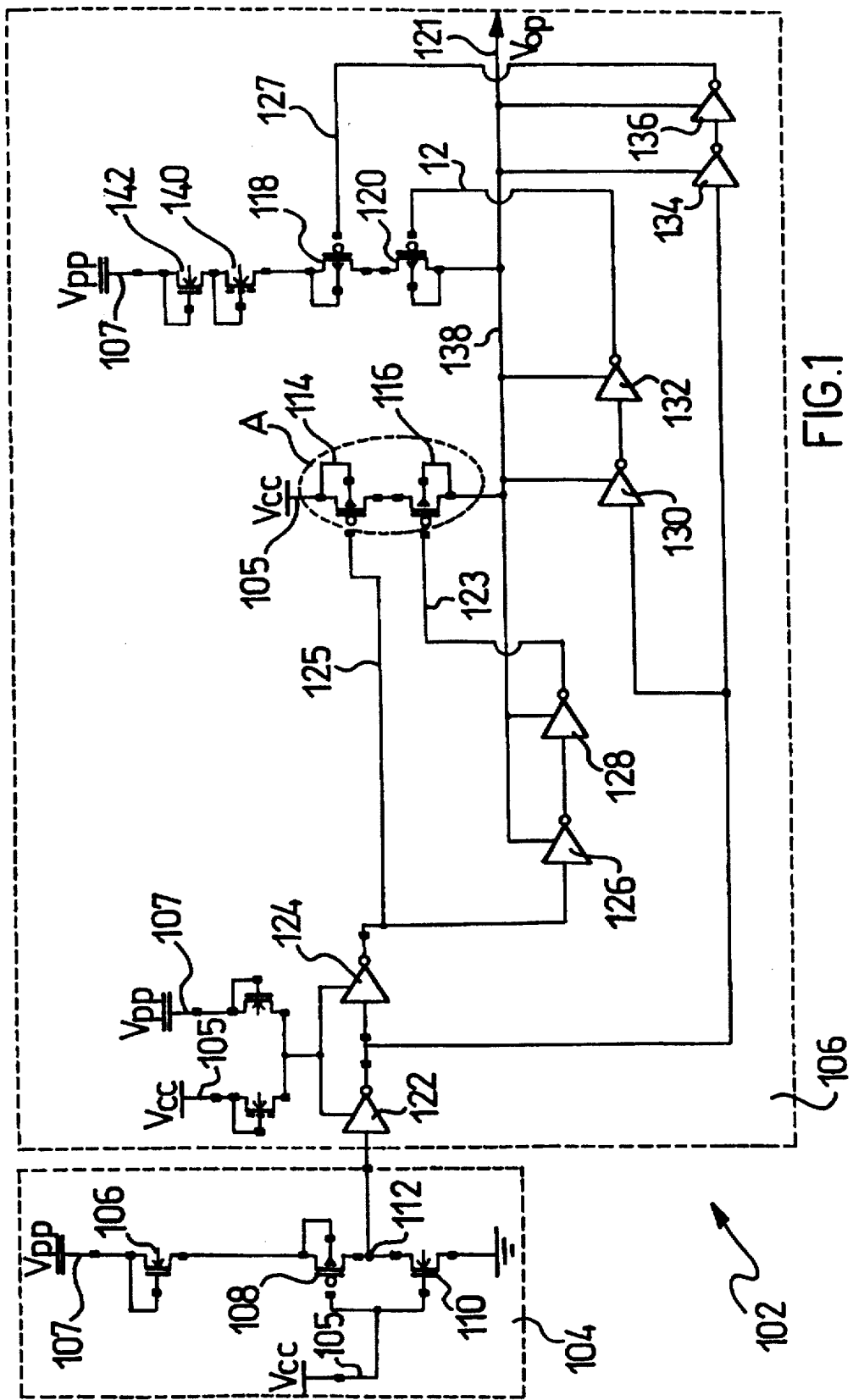
FIG. 1 shows a circuit for a dual sourced voltage supply circuit embodying the present invention.

Reference will first be made to dual sourced voltage supply circuit 102 shown in FIG. 1. Circuit 102 has two stages 104 and 106. The first stage 104 has inputs 105, 107 from circuits which normally supply Vcc and Vpp and is arranged to generate an output 112 having a first value when Vpp is present regardless of whether or not Vcc is present. The output 112 generates a second value when only Vcc is present. The second stage 106 of the circuit 102 generates, in dependence on the output of the first stage 104 an output voltage Vop from either Vcc or Vpp. In particular, the output voltage Vop will be generated from Vpp when Vpp is present, regardless of whether or not Vcc is present. The output voltage Vop will only be generated from Vcc when Vcc alone is present.

Referring to the first stage 104 in more detail, this stage has three MOSFETs 109, 108 and 110 connected in series between Vpp and ground. MOSFET 106 is a n-channel device connected as a diode, i.e., with its gate connected to the drain thereof. Typically, this MOSFET will have a width to length ratio of 10/3 and a threshold value of 0.8 V.

The source of MOSFET 109 is connected to the source of MOSFET 108 which is a p-channel device. The gate of this MOSFET is connected to Vcc. There is also a bulk or body connection between the substrate of the MOSFET (e.g. an n-well) and the source of MOSFET 108. Typically this device has a width to length ratio of 10/5 and a threshold value of 0.9 V.

The drain of MOSFET 108 is connected to the drain of an n-channel MOSFET 110, the source of which is connected to ground. The gate input is, like MOSFET 108, provided by Vcc. MOSFET 110 has a relatively low current carrying capacity compared with MOSFET 108 and has a width to length ratio of 3/150 and a threshold voltage of 0.8 V.

The output 112 of the first stage 104 is taken from a node which is between MOSFET 108 and MOSFET 110.

The operation of the first stage 104 will now be described. When Vpp is present, but not Vcc, the following situation occurs. MOSFET 106 and MOSFET 108 will be on while MOSFET 110 will be off. Thus node 112 and accordingly the output of the first stage 104 will be high and is approximately equal to Vpp less the voltage dropped across MOSFET 109. Typically this output will be ~8 V when Vpp is 12 V.

If Vpp and Vcc are both present, MOSFETs 109, 108 and 110 will all be on. MOSFET 108 is on as the source voltage is higher than the gate voltage. However as MOSFET 110 has a lower current carrying capacity compared with MOSFET 108, it cannot pull down to ground node 112 and accordingly the output of the first stage 104 remains relatively high (although not as high as in the first case). Finally, if only Vcc is present, MOSFET 109 will be off as will MOSFET 108. MOSFET 110 will be on. As MOSFET 110 is the only device on, it is able to pull node 112 down to ground so that the output of the first stage 104 is low.

The second stage 106 uses the output signal 112 from the first stage 104 to determine whether Vcc or Vpp should be used to generate the output voltage Vop. In particular the output signal from the first stage 104 is used to generate two pairs of signals 123, 125, 127, 129 which are used to control two pairs of p-channel MOSFETS, 114 and 116, and 118 and 120. The pairs of signals are used to switch on one of the MOSFET pairs and switch off the other. These MOSFET pairs, 114 and 116, and 118 and 120 are provided between the Vcc supply 105 and the output 121 of the generator and the Vpp supply 107 and the output 121 respectively. Thus these two MOSFET pairs 114 and 116, and 118 and 120 control which of Vpp and Vcc provide the output voltage. Typically MOSFETs 114 and 116 have a width to length ratio of 50/2 while MOSFETs 118 and 120 have a width to length ratio of 74/1.3.

The FET pairs are arranged such that when high voltage signals are provided on the gate of MOSFETs 114 and 116, low voltage signals are provided on the gates of MOSFETs 118 and 120 and vice versa. More particularly when the signals on the gates are high, the MOSFET pair in question will be off. However when the signals on the gates of the MOSFET pair are low, the MOSFET pair will be on, thus providing a current path between the voltage supply Vpp or Vcc to which the MOSFET pair are connected and the output 121 of the generator. This voltage supply will then provide the output voltage.

The pairs of signals 123, 125, 127 and 129 used to control the MOSFET pairs are generated by a series of inverters 122 to 136. Inverters 122 and 124 use Vcc supply 105 and/or Vpp supply 107 as the operating voltage depending on which of the voltage supplies are present while the remaining inverters 126 to 136 all use line 138 and thus Vop as the operating voltage supply. Line 138 is connected to the output 121.

The arrangement of the MOSFET pair 114 and 116 will now be described in more detail with reference to FIG. 2. MOSFET pair 118 and 120 has a similar construction and operation to that of the pair illustrated in FIG. 2.

The two MOSFETS 114 and 116 are provided on a p-type substrate 140. Each MOSFET 114 and 116 is provided in an n-well 142 with regions of p-type material forming the sources 144 and drains 146. Each MOSFET has an insulated gate 148 which receives the control signals generated from the output 112 of the first stage 104 and a body or substrate connection 150. The body or substrate connection 150 is provided to prevent a forward biased diode junction being formed between the source 144 and n-well 142. The body connection 150 holds the body or n-well 142 at a non-conducting voltage relative to the source 144 and generally holds the n-well 142 at the same voltage or at a higher voltage than the respective source 144.

Figure 2:
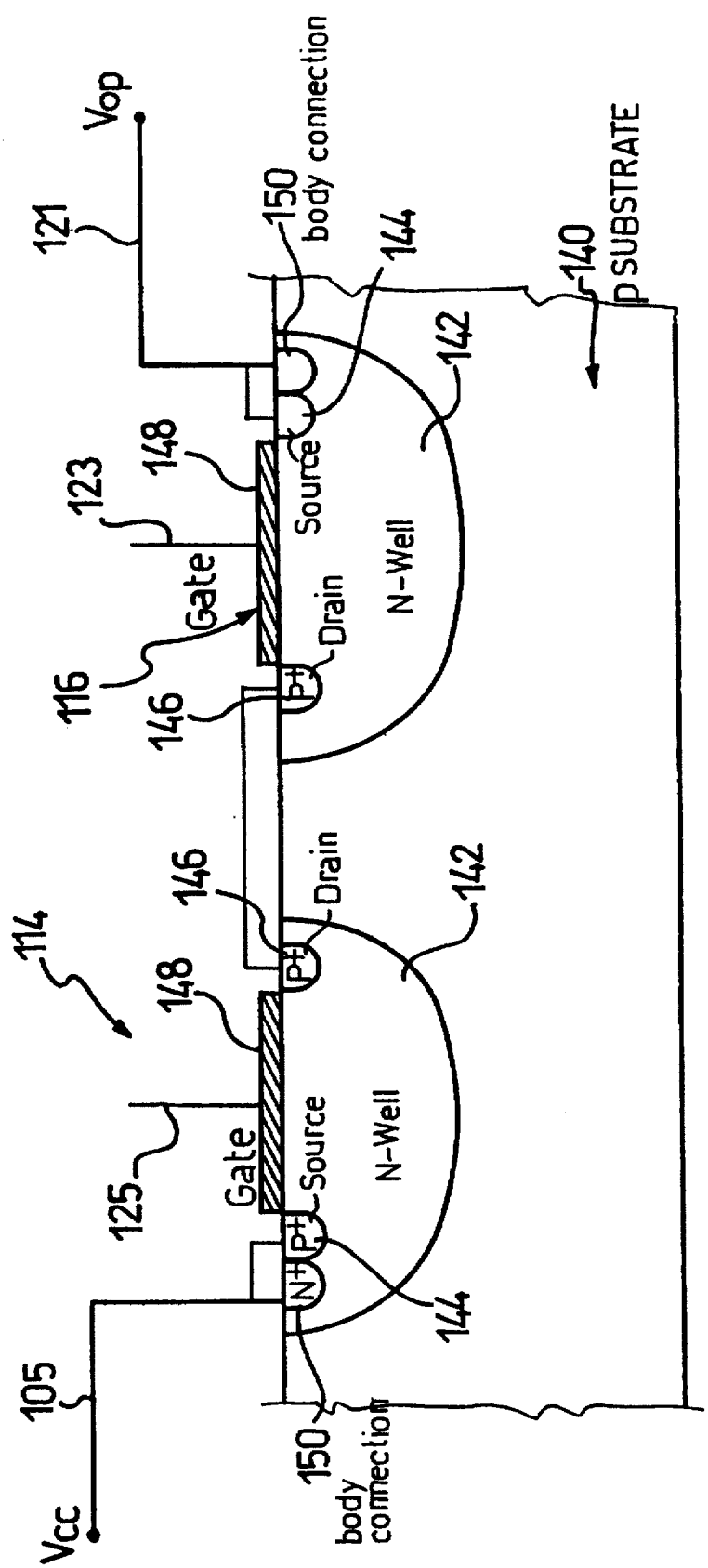
FIG. 2 shows a detailed cross-sectional view of circuit area A of FIG. 1 and in particular the construction of the two MOSFETs in that area.

As can be seen from FIG. 2, the two MOSFETS 114 and 116 are connected such that the drains 146 are connected together while the source 144 of MOSFET 114 is connected to the Vcc supply and the source 144 of MOSFET 116 is connected to the output 121 of the circuit which is at Vop.

The reasons for this particular configuration will now be discussed. Firstly, consider the case where Vcc is 0, 3.3 or 5 V, Vop is generated from Vpp and is equal to 7 or 8 V and only a single transistor corresponding to MOSFET 114 is provided. The drain 146 would be at a higher voltage than the n-well 142, held at the source voltage, that is Vcc. A forward biased diode would then be formed between the drain 146 and n-well 142. This is undesirable as current can then flow through the n-well 142 which can result in charge injection. Charge injection is to be avoided as the functionality of the MOSFET becomes unreliable and in certain circumstances permanent damage can be caused. In the extreme, latchup can occur where heavy conduction has been triggered resulting in permanent damage to the MOSFET. MOSFET 116 prevents a forward biased diode being formed as Vop is connected to the source 144 of MOSFET 116 and the n-well is held at the source voltage. The drain 146 of MOSFET 116 forms a reverse biased diode with the n-well 142. This protects the drain 146 of MOSFET 116 from forming a forward biased diode as its drain voltage 146 is at a lower voltage than its n-well 142.

Consider the situation where only MOSFET 116 is provided, and Vcc is connected to the drain 146. If Vcc is at a higher voltage than Vop then a forward biased diode may be formed between the drain 146 and n-well 142 as the source voltage would be less than the drain voltage. This situation may, for example, occur in the case where Vpp has been providing Vop and there is a changeover so that Vcc now provides Vop. MOSFET 114 is able to protect MOSFET 116 from charge injection as described above.

The two MOSFETs 114 and 116 connected as shown in FIG. 2 allow the circuit to operate reliable without risk of malfunction resulting from charge injection.

Furthermore, the two MOSFETs 114 and 116 are chosen to provide a reasonably low impedance so that an output voltage Vop generated from Vcc is substantially equal to Vcc.

The other pair of MOSFETs 118 and 120 are connected in series with two further n-channel MOSFETs 140 and 142 which have gate to drain connections so that they act as diodes. Accordingly, the output which is generated from Vpp is equal to Vpp less the threshold voltage dropped across the two n-channel MOSFETS 140 and 142. This typically would give an output voltage Vop of 7 or 8 V.

Figure 3:
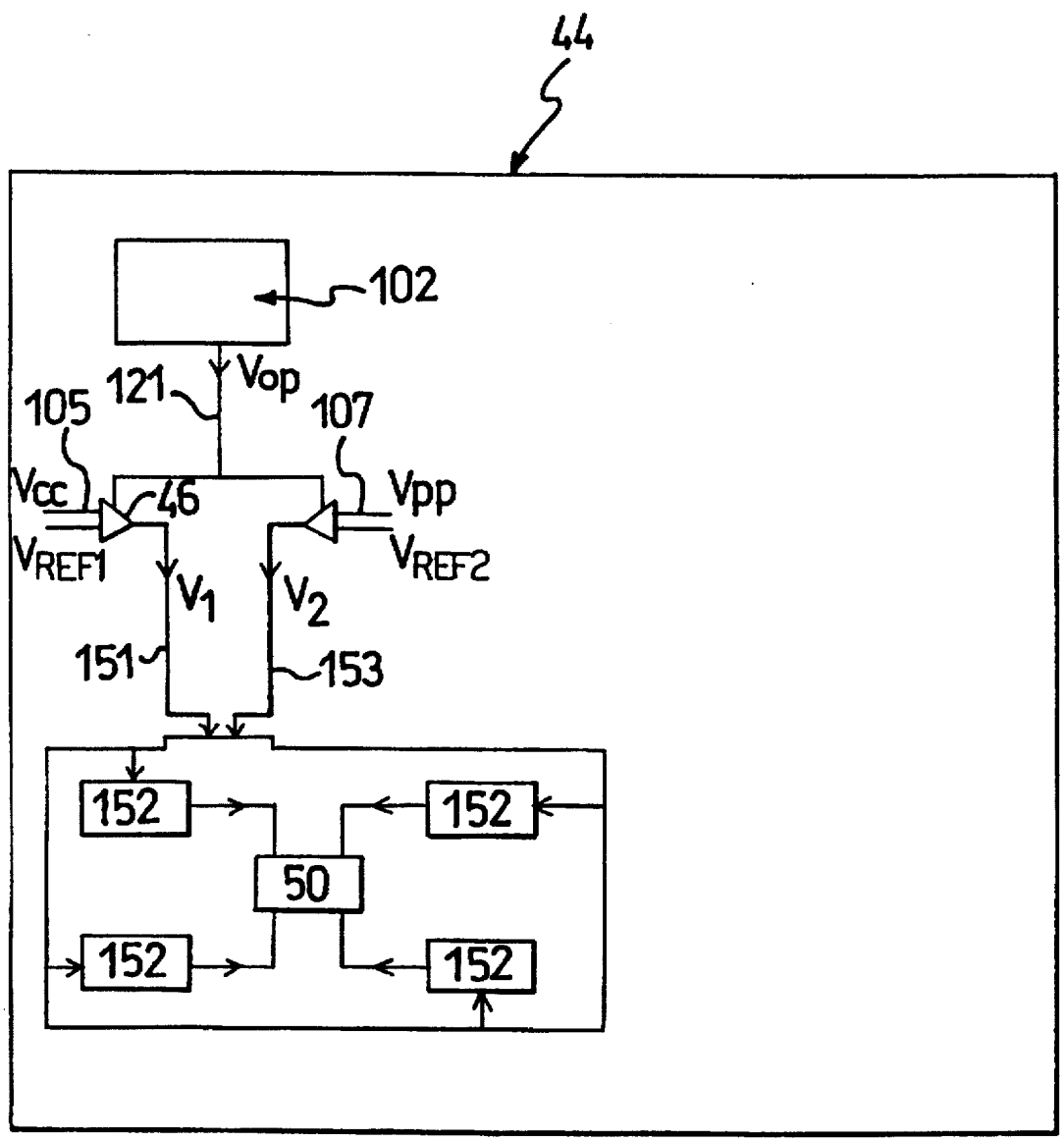
FIG. 3 shows a schematic view of a flash EPROM including the dual sourced voltage supply circuit of FIG. 1.

The dual sourced voltage supply circuit described hereinbefore is provided in a flash EPROM 144 which is shown schematically in FIG. 3. As can be seen from FIG. 3, the output 121 Vop of circuit 102 is used to provide the operating voltage for two comparators 146 and 148. Comparator 146 has two inputs one from Vcc and one from a reference voltage $V_{REF1}$ for Vcc. When Vcc is greater than $V_{REF1}$ an output signal V1 at a first level is provided by the comparator 146, for example a low level. When Vcc is less than $V_{REF1}$, the output signal V1 provided by comparator 146 has a second level which is relatively high. This high output signal V1 can be used by an array of single transistor memory cells 50 and their associated peripheral circuits 152 (shown schematically) to switch off any circuits which could provide a high programming voltage Vpp to the cells. In particular, output signal V1 is input directly to the peripheral circuits 152 to thereby switch off those circuits which provide high programming voltages to the array. By directly providing the switch off signal to the peripheral circuits 152, the relevant circuits are switched off directly and not through any logic arrangements. It can thereby be ensured that Vpp is not applied to any of the peripheral circuits.

Comparator 148 also has two inputs, one from Vpp and another from a second reference voltage $V_{REF2}$ for Vpp. When Vpp is greater than $V_{REF2}$, then the output signal V2 of comparator 148 will be low while if Vpp is less than $V_{REF2}$, then the output V2 of comparator 148 will be high. This high output signal can also be used, for example, to switch off the programming circuitry.

The dual sourced voltage supply circuit can also act as a guaranteed power source for various parts of the circuit where the loss of Vcc or Vpp could cause difficulties.

To assist in the understanding of the application of a dual source voltage supply circuit embodying the present invention in a flash memory, a brief description of the construction and operation of a flash memory follows.

Figure 4:
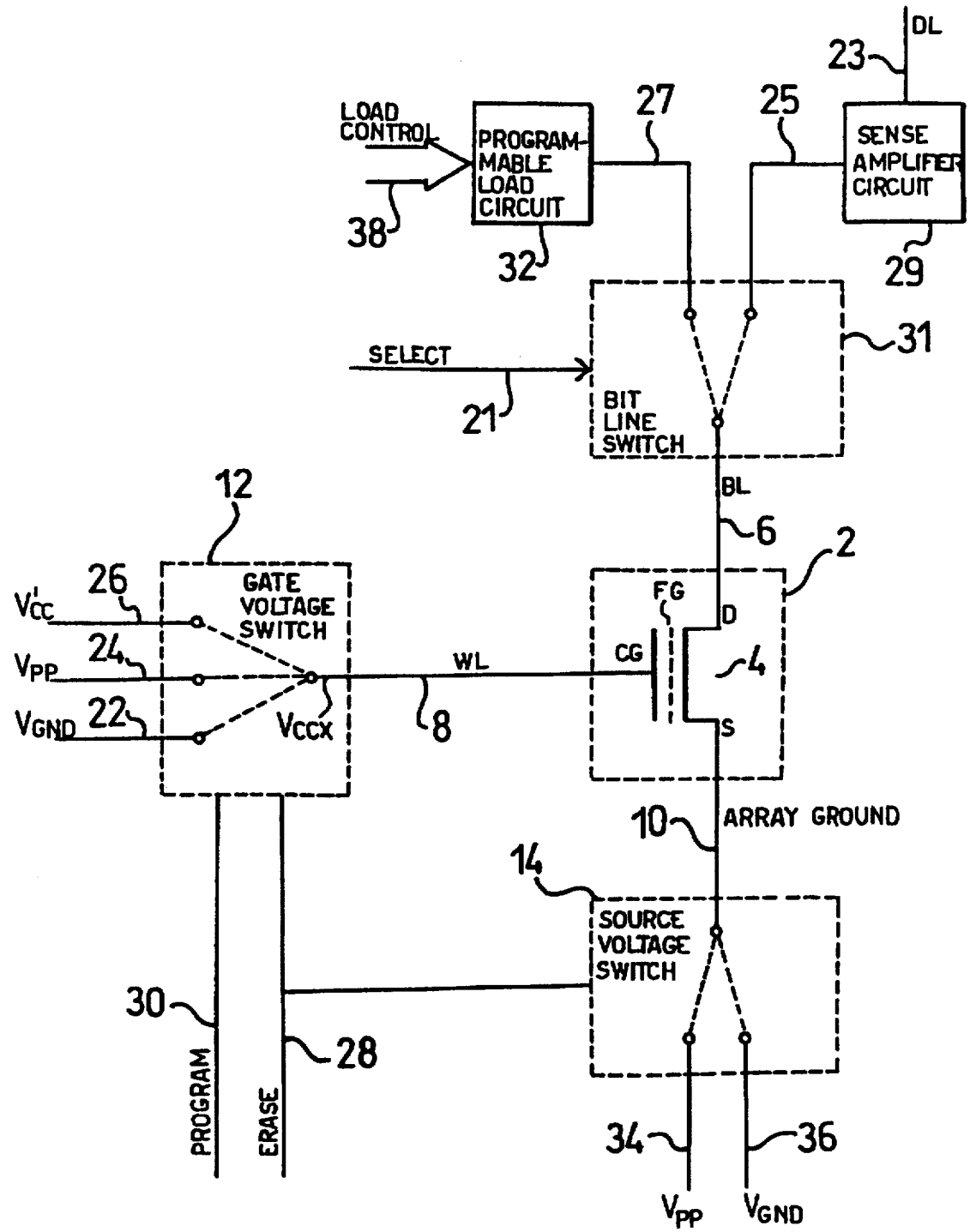
FIG. 4 shows a schematic diagram of a flash memory cell.

FIG. 4 illustrates a flash memory cell 2 comprising a single floating gate transistor 4 having a control gate CG, a floating gate FC, a source S, and a drain D. The source 5 of the floating gate transistor 4 is connected to an ARRAY GROUND signal on line 10. Through a source voltage switch circuit 14 this line 10 can be at a ground voltage VGND or a high voltage Vpp. Voltage Vpp represents a programming potential (typically 12 V) and voltage VGND represents device ground. Vpp is normally connected to array ground via a resistor (not shown). The source voltage switch 14 is connected to the voltage Vpp via line 34 and the voltage VGND via line 36. The control gate CG of the floating gate transistor 4 is connected to a gate voltage switch 12 by a word line (WL) 8. The gate voltage switch 12 is further connected to voltages V'cc, Vpp and VGND on lines 26, 24 and 22 respectively. V'cc is at 5 V for a 5 V part or is boosted to about 5 V for a 3 V part. These switches 14 and 12 each receive a control signal ERASE on line 28 and additionally the gate voltage switch 12 receives a control signal PROGRAM on line 30. The drain D of the floating gate transistor 4 is connected to a bit line switch 31 by a bit line (BL) 6. The bit line switch is further connected to the input of a programmable load circuit 32 on line 27 and the input of a sense amplifier circuit 29 on line 25. The output of the sense amplifier circuit 29 on line 23 forms a data line (DL). The switch 31 receives a control signal SELECT on line 21. The programmable load circuit 32 receives load control signals on lines 38.

The flash memory has three modes of operation: program, erase and read. Each of these modes will be described hereinafter with reference to FIG. 4. The program mode involves writing a "0" to a memory cell or group of memory cells, the erase mode involves removing a "0" from any cell that has a "0" stored in it such that the cells all effectively store "1"s, and the read mode involves reading a cell to establish whether it is programmed or erased, i.e., either a "0" or a "1".

During a program mode, the control signal PROGRAM on line 30 is set such that the gate voltage switch 12 is configured to connect the voltage Vpp on line 24 to the control gate CG of transistor 4 via word line 8. As the control signal ERASE on line 28 is not set the source voltage switch 14 is configured to connect the voltage VGND on line 36 to the source of transistor 4 via the ARRAY GROUND signal line 10. The control signal SELECT on line 21 is set such that the bit line on line 6 is connected to the programmable load 32 by line 27. The load control signals 38 control the programmable load 32 so that a voltage of about 5 V is on the drain D of the transistor 4 via the bit line 6. As a result of these signals applied to the transistor 4 the floating gate FG becomes negatively charged. The negative charge shifts the threshold voltage of the floating gate transistor making it less conductive. The amount of negative charge accumulated at the floating gate depends on the duration for which the control signal PROGRAM is set. In this way, a "0" is written into the cell. Normally, several program pulses are needed, each pulse being followed by a verify cycle.

During an erase mode, the control signal ERASE on line 28 is set such that the gate voltage switch 12 is configured to connect the voltage VGND on line 22 to the control gate CG of the transistor 4 via the word line 8, and such that the switch 14 is configured to connect the voltage Vpp on line 34 to the source S of the transistor 4 via the ARRAY GROUND line 10. The control signal SELECT on line 21 is again set such that the bit line 6 is disconnected so that it floats at a voltage of just under 1 V. As the floating gate transistor is fabricated such that the source region in the substrate underlies the floating gate, any negative charge on the floating gate will be reduced. The amount of negative charge removed from the floating gate FG depends on the duration for which the ERASE signal on line 28 is set. The reduction of negative charge shifts the threshold voltage of the floating gate transistor making it more conductive. In this way the state of the cell is restored to "1". Normally, several erase pulses are required, each erase pulse being followed by a verify cycle.

During a read mode, neither the control signal ERASE on line 28 nor the control signal PROGRAM on line 30 is set. Consequently, the V'cc signal on line 26 is connected by the source voltage switch 12 to the control gate of the transistor 4 via the word line 8 and the voltage VGND on line 36 is connected to the source of the transistor 4 via the ARRAY GROUND signal line 10. The bit line 6 is biased to approximately 1 volt prior to a read operation by a bit line load (not shown) within the sense amplifying circuit. During a read operation, for an erased cell (with "1" stored in it) the conductivity of the cell is such that current passes through the cell when the bit line is connected for sensing. For a programmed cell (with a "0" stored in it) substantially no current is passed by the cell. The current drawn by the cell is compared with a reference current to detect the status of the cell.

The operation of a flash cell in a memory array will now be described with reference to FIG. 5. Signal lines or circuitry common to FIG. 4 can be identified in FIG. 5 by use of the same reference numerals. Voltage supplies have not been illustrated in FIG. 5 for masons of clarity, but it will be understood with reference to FIG. 4 which voltages are required in various parts of the circuit.

Figure 5:
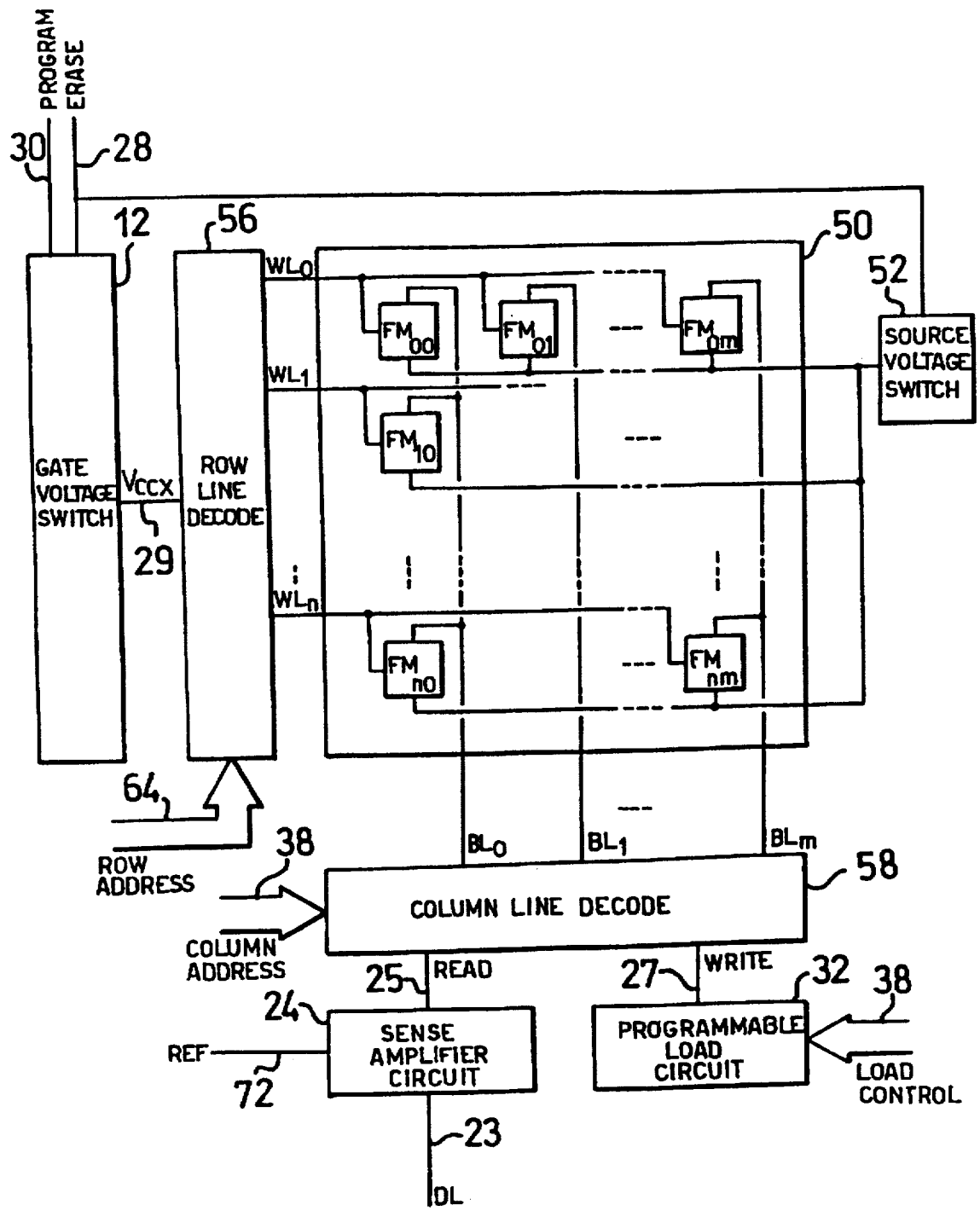
FIG. 5 shows a schematic diagram of a flash memory array.

FIG. 5 illustrates a flash memory array 50 comprising a plurality of flash memory cells FMoo ... FMnm, arranged in rows and columns, each of which can be the same as the cell 2 shown in FIG. 4. The gates of the transistors in each memory cell in a row are commonly connected to a respective word line WLo ... WLn addressable by a row line decode circuit 56 which receives the row address 64. The gate voltage switch 12 responds to the control signals PROGRAM and ERASE on line 30 and 28 respectively, and supplies the appropriate gate voltage Vccx on line 29 to be switched to the addressed wordline through the row decode circuit 56.

The drains of each transistor in a column are commonly connected by bit lines BLo ... BLm to a column line decode circuit 58. The column line decode circuit 58 can be considered as a plurality m of the bit line switch circuits 31, with the SELECT signal being generated responsive to the column address 38. The output of the column line decode circuit 58 on line 25 is a read output and is connected to the sense amplifier circuit 24. The sense amplifier 24 contains sense amplifiers and bit line load circuits. The column line decode circuit 58 receives a write input on line 27 from the programmable load circuit 32. The programmable load circuit is controlled by the load control signals 38. During a program or erase operation the bit lines BLo to BLm are selectively connected to the programmable load circuit 32. During a read operation the selected bit line (or bit lines) is connected to a sense amplifier in the sense amplifier circuit 24. The sense amplifier circuit 24 also receives a reference signal REF on line 72 and generates an output signal on the data line (DL) on line 23.

It will be appreciated that when a particular cell is chosen to be programmed, the programming load will only be applied to a selected column so that other cells in the same row as the selected cell are not inadvertently programmed. In addition in general during read and program operations it is desirable to apply certain signals to cells in the array which have not been selected to improve the performance of the cell, as is well known in the art. During an erase operation every cell in the memory array is erased, although it will be appreciated by a person skilled in the art that an array could be split into sectors for erasing so that only part of the array is erased at any one time. The table of FIG. 6 shows the voltages which need to be applied to the selected and unselected cells for each of a program, erase and read operation.

While the illustrated embodiment of the invention has been described in the context of a flash memory, it will be appreciated that the embodiments of the present invention can be used with other devices which use two different supply voltages, for example EEPROMS. Indeed the present invention can be used with any logic device having two supply voltages where the loss of one or other of these supply voltages can cause difficulties.

I claim:

1. A dual sourced voltage supply circuit formed in a semiconductor structure, comprising:

a first controllable conductive path connected between a first voltage supply and an output node, and being controlled by a first signal to connect the output node with the first voltage supply, the first controllable conductive path including a first transistor connected to the first voltage supply;

a second transistor connected in series between the first transistor and the output node, the first transistor having a body connection to the first voltage supply and the second transistor having a body connection to the output node;

a second controllable conductive path connected between a second voltage supply and the output node, and being controlled by a second signal to connect the output node with the second voltage supply; and a control circuit generating the second signal to connect the output node with the second voltage supply when the second voltage supply is present, and generating the first signal to connect the output node with the first voltage supply when the second voltage supply is not present.

2. The circuit according to claim 1 wherein the control circuit includes:
   a third transistor coupled to the second voltage supply, and having a control terminal connected to the first voltage supply; and
   a fourth transistor coupled in series between the third transistor and a reference potential, and having a control terminal connected to the first voltage supply.

3. The circuit according to claim 2 wherein the control circuit further includes an inverter having an input connected to a common node between the third and fourth transistors.

4. The circuit according to claim 2 wherein the fourth transistor is an n-channel transistor having a long channel to limit the current flowing therethrough.

5. The circuit according to claim 4 wherein the third transistor is a p-channel transistor.

6. The circuit according to claim 5, further comprising a fifth transistor configured as a diode and coupled in series between the second voltage supply and the third transistor.

7. A dual sourced voltage supply circuit formed in a semiconductor structure, comprising:
   a first controllable conductive path connected between a first voltage supply and an output node, and being controlled by a first signal to connect the output node with the first voltage supply, the first controllable conductive path including
   a first transistor connected to the first voltage supply;
   a second transistor connected in series between the first transistor and the output node, the first transistor having a body connection to the first voltage supply and the second transistor having a body connection to the output node;
   a second controllable conductive path connected between a second voltage supply and the output node, and being controlled by a second signal to connect the output node with the second voltage supply, the second controllable conductive path including
   a third transistor connected to the second voltage supply; and
   a fourth transistor connected in series between the third transistor and the output node, the third transistor having a body connection to the second voltage supply and the fourth transistor having a body connection to the output node.

8. The circuit according to claim 7 wherein the first and second transistors are p-channel devices.

9. A dual sourced voltage supply circuit for use with a flash EPROM or the like, said circuit comprising output voltage circuitry comprising an input for receiving a control signal, said control signal determining which of two voltage supplies is used to provide an output voltage of said circuit, said output voltage being provided by one of said two voltage supplies by means of a first controllable conductive path connected between said one voltage supply and an output node of said circuit, said first controllable conductive path comprising, in series, a first MOSFET transistor connected to said one voltage supply and a second MOSFET transistor connected to the output node, said first and second MOSFET transistors being of the same conductivity type and each MOSFET transistor having a respective body connection connected to its channel electrode, the body connections of said first and second MOSFET transistors being arranged to prevent charge injection occurring between the other channel electrode and the body of the second and first MOSFET transistors respectively, the first and second MOSFET transistors being arranged to be activated in dependence on the control signal; and
   wherein the output voltage is provided by the other of said two voltage supplies by a second controllable conductive path connected between said other voltage supply and the output node, said second controllable conductive path having third and fourth MOSFET transistors of the same conductivity type and each MOSFET transistor having a respective body connection connected to its channel electrode, the body connections of said third and fourth MOSFET transistors being arranged to prevent charge injection occurring between the other channel electrode and the body of the fourth and third MOSFET transistors respectively, the third and fourth MOSFET transistors being arranged to be activated in dependence on the control signal.

10. A circuit as claimed in claim 9 wherein said MOSFET transistors in each of said first and second controllable conductive paths are p-channel devices arranged with their drains connected together and their sources connected to one of the voltage supplies and the output node respectively.

11. A circuit as claimed in claim 10 wherein the body connections of said MOSFET transistors are tied to the respective sources of said MOSFET transistors or points having a more positive voltage than the respective sources.

12. A circuit as claimed in claim 9 wherein each controllable conductive path is arranged so that negligible current flow occurs in that path, whereby said output voltage provided by one of said two voltage supplies is substantially equal to said one voltage supply.

13. A circuit as claimed in claim 9 wherein said circuit further comprises determining circuitry having at least one input from at least one of said two voltage supplies and providing said control signal to the input of the output voltage circuitry.

14. A circuit as claimed in claim 13 wherein said determining circuitry has inputs from both of said two voltage supplies and provides a first signal to the input of the output voltage circuitry when a first of said voltage supplies is present, regardless of the presence or absence of the second voltage supply and a second signal when only the second voltage supply is present.

15. A circuit as claimed in claim 9, wherein one voltage supply is greater than the other.

16. A circuit as claimed in claim 9 wherein said output voltage circuitry has signal generating circuitry which generates two pairs of signals whereby when the MOSFET transistors of one of the controllable conductive paths are switched on, the MOSFET transistors of the other controllable conductive path are switched off.

17. A circuit as claimed in claim 16, wherein said signal generating circuitry comprises a series of inverters.

18. A flash EPROM having two voltage supplies and a dual sourced voltage supply circuit comprising:
   determining circuitry having at least one input from at least one of said two voltage supplies for providing an output which determines which of the two voltage supplies is to provide an output voltage; and
   output voltage circuitry having an input connected to the output of said determining circuitry, said output voltage circuitry operable to provide an output voltage from one of said two voltage supplies in dependence on the output from the determining circuitry, wherein the output voltage is provided by one of the two voltage supplies by means of a controllable conductive path between said one voltage supply and an output node of the circuit, said controllable conductive path having two p-type MOSFET transistors connected between said one voltage supply and said output node respectively, the drains of the MOSFET transistors being connected together and the sources of the MOSFET transistors being connected to said one voltage supply and said output node, respectively, the MOSFET transistors having body connections tied to their respective sources, said MOSFET transistors being activated in dependence on the output from the determining circuitry.

19. A flash EPROM as claimed in claim 18, further comprising a comparator arrangement having inputs from one of said two voltage supplies and a reference voltage, the output voltage providing an operating voltage for the comparator arrangement, the comparator arrangement providing an output signal when said one voltage supply is less than the reference voltage to switch off circuits providing programming voltages to an array of memory cells of the flash EPROM.

20. A flash EPROM as claimed in claim 19 wherein the output signal of the comparator arrangement is connected to said circuits to be switched off.

21. A flash EPROM as claimed in claim 18 wherein said one voltage supply is 12 V and the other voltage supply is 3.3 V or 5 V.

22. A flash EPROM as claimed in claim 18 wherein one of the controllable conductive paths further comprises diode elements whereby the output voltage provided is less than the respective voltage supply from which it is derived.

23. A flash EPROM as claimed in claim 21 wherein said dual sourced voltage supply circuit is arranged to act as a guaranteed power supply for circuitry of said flash EPROM.

24. A voltage supply circuit having first and second voltage inputs of different voltage levels, a voltage output connectable to said first voltage input through a first switch circuit and connectable to said second voltage input through a second switch circuit, each of said switch circuits comprising two MOSFET transistors of the same conductivity type, said MOSFET transistors being connected back to back in series, each having a respective source to body connection, one source being connected to said voltage output, and control circuitry connected to said first and second switch circuits to operate said switch circuits and connect selectively only one of said voltage inputs to said voltage output, whereby there is substantially no voltage drop across said MOSFET transistors.

25. A voltage supply circuit as claimed in claim 24 wherein said MOSFET transistors in each of said switch circuits are p-channel devices having their respective drains connected together.

26. A voltage supply circuit as claimed in claim 24 wherein said first voltage input has an upper voltage level for use in erase and programming operations in a flash EPROM memory array and said second voltage input has an intermediate voltage level between said upper voltage level and a ground and said second switch circuit is connected between the second voltage input and the voltage output.

27. A dual sourced voltage supply circuit formed in a semiconductor structure, comprising:

a first controllable conductive path connected between a first voltage supply and an output node, and being controlled by a first signal to connect the output node with the first voltage supply, the first controllable conductive path including a first transistor connected to the first voltage supply;
a second transistor connected in series between the first transistor and the output node, the first transistor having a body connection to the first voltage supply and the second transistor having a body connection to the output node;

a second controllable conductive path connected between a second voltage supply and the output node, and being controlled by a second signal to connect the output node with the second voltage supply; and a control circuit including a third p-channel transistor coupled to the second voltage supply, the third p-channel transistor having a control terminal connected to the first voltage supply, and a fourth n-channel transistor coupled in series between the third p-channel transistor and a reference potential, the fourth n-channel transistor having a control terminal connected to the first voltage supply and a long channel to limit the current flowing therethrough, the control circuit generating the second signal to connect the output node with the second voltage supply when the second voltage supply is present, and generating the first signal to connect the output node with the first voltage supply when the second voltage supply is not present.

28. A dual sourced voltage supply circuit for use with a flash EPROM or the like, said circuit comprising output voltage circuitry comprising an input for receiving a control signal, said control signal determining which of two voltage supplies is used to provide an output voltage of said circuit, said output voltage being provided by one of said two voltage supplies by means of a first controllable conductive path connected between said one voltage supply and an output node of said circuit, said first controllable conductive path comprising, in series, a first MOSFET transistor connected to said one voltage supply and a second MOSFET transistor connected to the output node, said first and second MOSFET transistors being of the same conductivity type and each MOSFET transistor having a respective body connection connected to its channel electrode, the body connections of said first and second MOSFET transistors being arranged to prevent charge injection occurring between the other channel electrode and the body of the second and first MOSFET transistors respectively, the first and second MOSFET transistors being arranged to be activated in dependence on the control signal;

wherein the output voltage is provided by the other of said two voltage supplies by a second controllable conductive path connected between said other voltage supply and the output node, said second controllable conductive path having third and fourth MOSFET transistors of the same conductivity type and each MOSFET transistor having a respective body connection connected to its channel electrode, the body connections of said third and fourth MOSFET transistors being arranged to prevent charge injection occurring between the other channel electrode and the body of the fourth and third MOSFET transistors respectively, the third and fourth MOSFET transistors being arranged to be activated in dependence on the control signal; and wherein each controllable conductive path is arranged so that negligible current flow occurs in that path, whereby said output voltage provided by one of said two voltage supplies is substantially equal to said one voltage supply.

29. A dual sourced voltage supply circuit for use with a flash EPROM or the like, said circuit comprising output voltage circuitry comprising an input for receiving a control signal, said control signal determining which of two voltage supplies is used to provide an output voltage of said circuit, said output voltage being provided by one of said two voltage supplies by means of a first controllable conductive path connected between said one voltage supply and an output node of said circuit, said first controllable conductive path comprising, in series, a first MOSFET transistor connected to said one voltage supply and a second MOSFET transistor connected to the output node, said first and second MOSFET transistors being of the same conductivity type and each MOSFET transistor having a respective body connection connected to its channel electrode, the body connections of said first and second MOSFET transistors being arranged to prevent charge injection occurring between the other channel electrode and the body of the second and first MOSFET transistors respectively, the first and second MOSFET transistors being arranged to be activated in dependence on the control signal;

wherein the output voltage is provided by the other of said two voltage supplies by a second controllable conductive path connected between said other voltage supply and the output node, said second controllable conductive path having third and fourth MOSFET transistors of the same conductivity type and each MOSFET transistor having a respective body connection connected to its channel electrode, the body connections of said third and fourth MOSFET transistors being arranged to prevent charge injection occurring between the other channel electrode and the body of the fourth and third MOSFET transistors respectively, the third and fourth MOSFET transistors being arranged to be activated in dependence on the control signal; and determining circuitry having inputs from both of said two voltage supplies and providing a first signal to the input of the output voltage circuitry when a first of said voltage supplies is present, regardless of the presence or absence of the second voltage supply, and a second signal when only the second voltage supply is present.

* * * * *